United States Patent [19]
Moore et al.

[11] Patent Number: 5,471,173
[45] Date of Patent: Nov. 28, 1995

[54] CASCADED AMPLIFIER HAVING TEMPERATURE COMPENSATION

[75] Inventors: Paul A. Moore, Seaford; Anthony R. Cusdin, Horley, both of England

[73] Assignee: U.S. Philips Corporation, New York, N.Y.

[21] Appl. No.: 269,811

[22] Filed: Jun. 30, 1994

[30] Foreign Application Priority Data

Jul. 5, 1993 [GB] United Kingdom .................. 9313840

[51] Int. Cl.[6] .................................................. H03F 3/45
[52] U.S. Cl. ......................... 330/256; 327/350; 327/351
[58] Field of Search ................................ 327/350, 351, 327/362; 330/252, 256, 289, 310

[56] References Cited

U.S. PATENT DOCUMENTS

| | | | |
|---|---|---|---|
| 4,546,321 | 10/1985 | Bateman et al. | 327/350 |
| 4,604,532 | 8/1986 | Gilbert | 327/350 |
| 5,338,985 | 8/1994 | Fotowat-Ahmady et al. | 327/350 |

OTHER PUBLICATIONS

W. L. Barber et al, "A True Logarithmic Amplifier for Radar IF Applications", IEEE Journal of Solid–State Circuits, vol. SC–15, No. 3, Jun. 1980, pp. 291–295.

*Primary Examiner*—Steven Mottola
*Attorney, Agent, or Firm*—Michael J. Balconi-Lamica; Laurie E. Gathman

[57] ABSTRACT

A cascaded amplifier is comprised of a number of amplifying stages connected in cascade such as the dual emitter-coupled amplifier shown. A first pair of transistors (14,20) provides limiting amplification and a second pair of transistors (16,18) with degeneration (22,24) provide linear amplification. Each pair of transistors is driven by a current source (28,26) which supplies a current (IT, IT2) proportional to absolute temperature (PTAT). The small signal amplification is then substantially independent of temperature and the value of the limited output is proportional to absolute temperature. This latter effect is countered by including a translinear variable current gain amplifier (54, 56,58,60) in the last dual-gain stage of the cascaded amplifier to modify the output voltage in a manner inversely proportional to absolute temperature. A transfer function may thus be provided which is substantially independent of temperature.

13 Claims, 4 Drawing Sheets

CASCADED AMPLIFIER HAVING TEMPERATURE COMPENSATION

BACKGROUND OF THE INVENTION

1. Field of the Invention

The present invention relates to a cascaded amplifier with temperature compensation having particular, but not exclusive, application for use as a logarithmic amplifier for dynamic range reduction in radio receiver applications.

2. Description of the Related Art

Piecewise approximations to logarithmic transfer functions are known to be provided by cascaded amplifiers comprising several amplifying stages. A true logarithmic amplifier is the name given to a logarithmic amplifier whose output retains information about the sign of the input signal as opposed to amplifiers which rectify the input signal to provide an output which is logarithmically proportional to the magnitude of the input signal only. Such an amplifier is described in "A True Logarithmic Amplifier for Radar IF Applications" by William L. Barber and Edmund R. Brown in the IEEE Journal of Solid-State Circuits, Vol. SC15, No. 3, June 1980. The paper describes a logarithmic amplifier which consists of a cascade of dual gain amplifying stages. Each stage comprises a limiting amplifier designed to be driven into limiting at a given input voltage and a unity gain amplifier arranged in parallel with the limiting amplifier. As the input level to the cascaded amplifier rises, the limiting amplifiers in consecutive dual gain stages are driven into limiting, starting with the last one in the chain. The overall gain of the amplifier decreases as the input voltage level rises and a piecewise approximation to a logarithmic function results. The larger the number of amplifier stages, the more accurate is the approximation to the function and/or the greater the input dynamic range with which the amplifier can operate. The small signal gain of each amplifier stage in a typical logarithmic amplifier might be 10dB.

The amplifier stages described in the above-mentioned article each comprise two long-tailed pair transistor amplifiers driving a common load resistor. One of the long-tailed pairs has degeneration to provide a unity gain amplifier with no limiting and the other has no degeneration (other than that inherent in the transistors) to provide an amplifier having a high gain for small-signal inputs but which limits at larger signal inputs. A cascaded chain of such amplifier stages can be arranged to give a good approximation to a logarithmic transfer function.

The main drawback of this known design of cascaded amplifier is that the amplitude transfer characteristics vary widely with variations in temperature.

SUMMARY OF THE INVENTION

It is an object of the present invention to provide a cascaded amplifier with reduced sensitivity to temperature changes.

According to the present invention there is provided a cascaded amplifier comprising a plurality of amplifying stages connected in cascade, each amplifying stage comprising a linear amplifier and a limiting amplifier, the linear amplifier and the limiting amplifier being provided with a stage input signal and providing respective output signals which are combined to provide a stage output signal, wherein each amplifying stage in the cascade further comprises temperature dependent means for controlling the small signal gain of that amplifying stage to be substantially independent of temperature and a final stage of the amplifier comprises temperature dependent means for controlling the overall output limit voltage of the cascaded amplifier to be substantially independent of temperature. A two-step temperature compensation technique is thus employed.

One possible type of the temperature dependent means may comprise a current source having an output proportional to absolute temperature. Such a current source may consist of a pair of transistors connected as a current mirror in which the emitter of one of the transistors has an area of twice that of the transistor with which it is paired. The larger emitter is loaded with a resistor which develops a voltage across it equal to the difference, $V_{diff}$, in the base emitter voltages of the two transistors in that pair and this voltage determines the current passed by the whole arrangement. This pair of transistors is forced to carry equal currents by another current mirror. Since the voltage $V_{diff}$ is proportional to absolute temperature, the current passed by the whole arrangement is proportional to absolute temperature.

Such a current source may be arranged to provide the tail current for an amplifying stage comprised of long-tailed pair transistor amplifiers. When used to control the gain of such amplifying stages, such current sourcing means will make the small signal gain of the stages substantially independent of temperature but will cause the limiting voltage of the limiting amplifiers in the stages to be proportional to absolute temperature. The error in the output limiting voltage of the overall amplifier caused by such limiting voltage errors is corrected by altering the limiting voltage of the final amplifying stage of the amplifier to be substantially independent of temperature. One possible technique to achieve this is to include means in the final amplifying stage to alter the gain of that stage to be inversely proportional to absolute temperature. Such means may comprise a translinear variable current amplifier to modify the gain of the final amplifying stage. The translinear variable current amplifier is driven by a current source whose output is substantially independent of temperature, Experiments have shown that a logarithmic amplifier constructed in accordance with the present invention has a substantially invariant logarithmic performance for a 55dB range of input values over a temperature range of –20° C. to +75° C.

It has further been appreciated that an amplifier in accordance with the invention may be arranged to provide a large variety of sub-linear, super-linear and generally non-linear transfer functions in addition to a logarithmic one. By arranging the limiting amplifier in one or more amplifying stages to provide a negative value of gain, in other words an inverting amplifier, a cascaded amplifier having a superlinear characteristic over some or all of its operating range may be provided. A wide range of generally non-linear transfer functions are thus available.

The present invention further relates to a radio receiver including a down-conversion stage whose output is coupled to a temperature compensated cascaded amplifier in accordance with the invention, which cascaded amplifier is arranged to provide a substantially logarithmic transfer function.

BRIEF DESCRIPTION OF THE DRAWINGS

The present invention will now be described, by way of example, with reference to the accompanying drawings, in which.

DETAILED DESCRIPTION OF THE PREFERRED EMBODIMENTS

Figure 1:
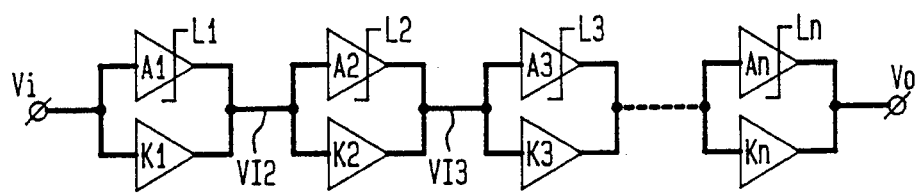
FIG. 1 shows a cascaded chain of amplifier stages.

FIG. 1 shows a cascaded chain of n amplifying stages having an input Vi to the first stage and an output Vo from the final stage. Each of these stages comprises a limiting amplifier A1,A2,A3 . . . An arranged to provide amplification up to a limiting output level L1,L2,L3 . . . Ln and a linear amplifier k1,k2,k3 . . . kn connected in parallel with the limiting amplifier. The cascaded amplifier can give a good approximation to a number of transfer functions. The first linear amplifier in the chain, k1, may be omitted as will be discussed later. One or more filters (not shown) may be placed in the chain to improve the noise performance of the amplifier.

Figure 2:
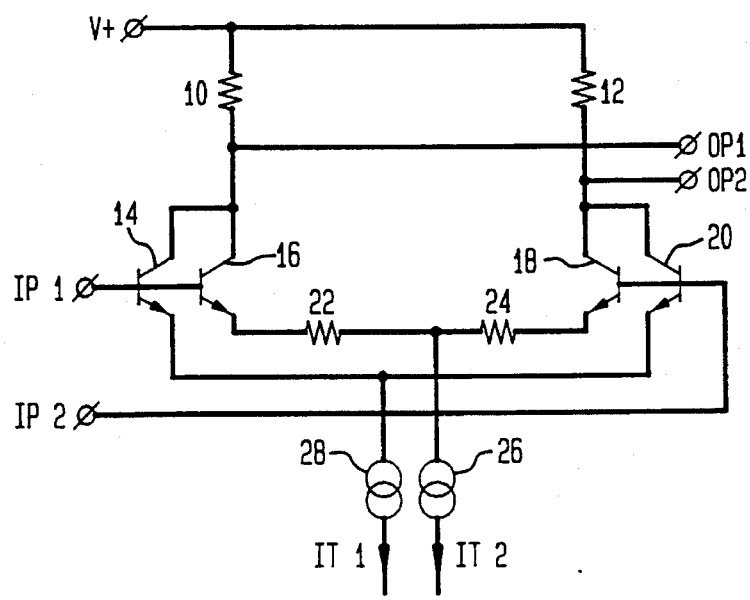
FIG. 2 shows a schematic diagram of a long-tailed pair amplifying stage.

FIG. 2 shows a schematic diagram of an amplifying stage, or dual gain stage, suitable for use in a cascaded amplifier. The dual gain stage shown comprises a positive supply rail V+ connected to a first terminal of each of two resistors 10,12 whose second terminals are connected to a stage output terminal OP1 and to a stage output terminal OP2 respectively. The second terminal of the resistor 10 is also connected to the collectors of two NPN transistors 14,16 and the resistor 12 is connected to the collectors of two NPN transistors 18,20. The bases of the transistors 14,16 are connected together and to a first input terminal IP1 and the bases of the transistors 18,20 are connected together and to a second input terminal IP2. The emitters of the transistors 14,20 are connected together and to a current source 28 which sources a current IT1 away from the transistors. The emitter of the transistor 16 is coupled via a resistor 22 to a current source 26 which sources a current IT2 away from the transistors. IT1 and IT2 are generally different from each other and IT2 will be greater for the later stages in the amplifier to provide more headroom for the signal being amplified. The emitter of the transistor 18 is connected via a resistor 24 to the junction of the resistor 22 with the current source 26. The dual gain stage thus comprises two emitter-coupled stages arranged as long-tailed pairs with the collectors and bases of the transistors between the pairs connected together and the long-tailed pairs having common load resistors. The pairs of transistors 14,16 and 18,20 may each comprise a single transistor with two emitters. A reversed circuit arrangement is possible by inverting the supply voltage and the current sources and replacing the transistors by PNP types.

In operation the emitter resistors 22,24 provide degeneration for the long-tailed pair 16,18 and the resistor values are chosen to prevent limiting so that this pair of transistors provides a linear gain over the whole range of possible stage input voltages. For a cascade of similar stages providing a logarithmic transfer function it can be shown that the gain of the linear amplifier in each stage must be equal to one. The pair of transistors 14,20 have no external emitter resistors and thus provide a higher gain than the transistors 16,18. However, at input levels above a certain threshold, the transistors 14,20 will be driven into limiting, in other words one of them will be hard-on and the other will be hard-off, and thus provide no further gain. The transfer characteristic of a dual gain stage therefore comprises a high linear gain at low input levels followed by a smaller linear gain (equal to unity for a logarithmic amplifier) at higher input levels. The circuit is typically followed by an emitter-follower stage to buffer the stage output against subsequent loading and provide DC level shifting. In certain circumstances, this cascaded amplifier is provided with a first amplifying stage having no linear amplifier as will be discussed later. To provide an amplifying stage without a linear amplifier, the circuit components 16, 18, 22, 24 and 26 should be omitted.

Figure 3:
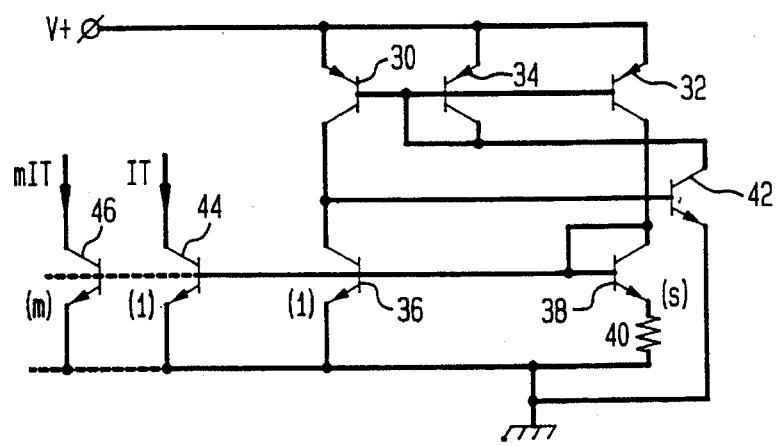
FIG. 3 shows a schematic diagram of a temperature dependent current sourcing means suitable for use in a cascaded amplifier made in accordance with the present invention.

As stated previously, a dual gain stage such as that described has a gain characteristic which is dependent upon changes in temperature and is also dependent upon resistor value variations to a smaller degree. To ameliorate these disadvantages the current sources 26,28 are arranged to provide currents IT1,IT2 which are proportional to absolute temperature (PTAT). A current source to provide a number of PTAT currents is shown in FIG. 3.

A positive supply voltage V+ is connected to the emitters of three PNP transistors 30,32,34. The bases of these transistors are connected together, to the collector of the transistor 34 and to the collector of a NPN transistor 42. The collector of the transistor 30 is connected to the collector of a NPN transistor 36 and to the base of the transistor 42. The emitter of the transistor 36 is connected to ground and to one terminal of a resistor 40. The other terminal of the resistor 40 is connected to the emitter of the transistor 38. The collector and base of the transistor 38 are connected together, to the base of transistor 36 and to the bases of two NPN transistors 44,46. The dotted lines in the connection to the base of transistor 46 signify that a number of further NPN transistors may be added to the circuit. The emitters of the transistors 42,44,46 are connected to ground. A start-up circuit (not shown) as is well known in the art should also be provided since the circuit has a stable state in which no current flows.

The transistors 30,32,34 form a current mirror whose purpose is to force the collectors (and hence the emitters) of transistors 36,38 to carry an equal current IT. The emitter of the transistor 38 is arranged to have an area greater than the emitter of the transistor 36 by a factor s. This is shown by a bracketed letter s in the drawing, and the transistor 38 thus operates at a current density of 1/s times that of the transistor 36. A typical value for s is two so the transistor 38 would operate at half the current density of the transistor 36. The transistors 36,38 are closely thermally matched and so the emitter voltage of the transistor 38 will be higher than that of the transistor 36 by a voltage differential $V_{diff}$. $V_{diff}$ is proportional to absolute temperature (PTAT) and appears across the resistor 40. The current through the resistor 40 is given by Ohm's Law to be the differential voltage divided by the value of the resistor. Should the collector currents of transistors 30,36 differ, this is sensed by the transistor 42 which feeds it back to the current mirror comprised of transistors 30,32. The transistors 44,46 are closely thermally matched to the transistors 36,38 and they operate at the same base voltage. The current passed by the transistors 44,46 is thus determined by their emitter areas. Transistor 44 has an equal sized emitter to transistor 36 as depicted by a bracketed numeral 1 next to it. Transistor 46 has an emitter m times the size of that of transistors 36,44 as depicted by a bracketed letter m. Consequently the collector currents passed by transistors 44,46 are IT and mIT as shown. These and further transistors having various sized emitters may be used in this circuit to provide the PTAT currents IT1 and IT2 for all of the stages of the cascaded amplifier. As an alternative, the transistors 44,46 and all of the further transistors may be arranged to provide a current of, for example, IT and integer multiples of IT can be used to provide the currents IT1,IT2 by connecting the appropriate number of further transistors in parallel. This type of current source arrangement is known to also provide good independence of supply voltage variation.

The current IT passed by each of the transistors 36,38 is substantially given by $$IT = \frac{kT}{Rq} \ln(s)$$

where k is Boltzman's constant, T is absolute temperature, R is the value of the resistor 40, q is the charge on an electron and s is the size of the emitter of transistor 38 with respect to the size of the emitter of transistor 36. By replacing the emitter size s with the appropriate emitter size m, this equation can be used to derive the currents provided by the further transistors. The currents provided by the current source to at least the linear amplifiers in the amplifier stages will be greater for later stages in the cascade. This is to provide greater headroom for the later stages because they will usually be operating at greater output voltage swings than the earlier stages.

A more detailed discussion of the operation of the current source circuit shown in FIG. 3 can be found in Electronics Letters of 25th Apr. 1985, vol. 9, pages 384–386 together with a description of a more sophisticated circuit which may also be used with the present invention.

Using a circuit such as that shown in FIG. 3 for the current sources 26,28 (FIG. 2) makes the small signal gain of the amplifying stage shown in FIG. 2 substantially independent of changes in temperature. However, it also makes the output voltage at which the limiting amplifier of the amplifying stage limits proportional to absolute temperature and a cascaded amplifier comprised of such stages thus has an overall output limit voltage substantially proportional to absolute temperature. This effect is countered, in this example, by adding a translinear variable-gain current amplifier to the final, or nth, amplifying stage in the cascade.

Figure 4:
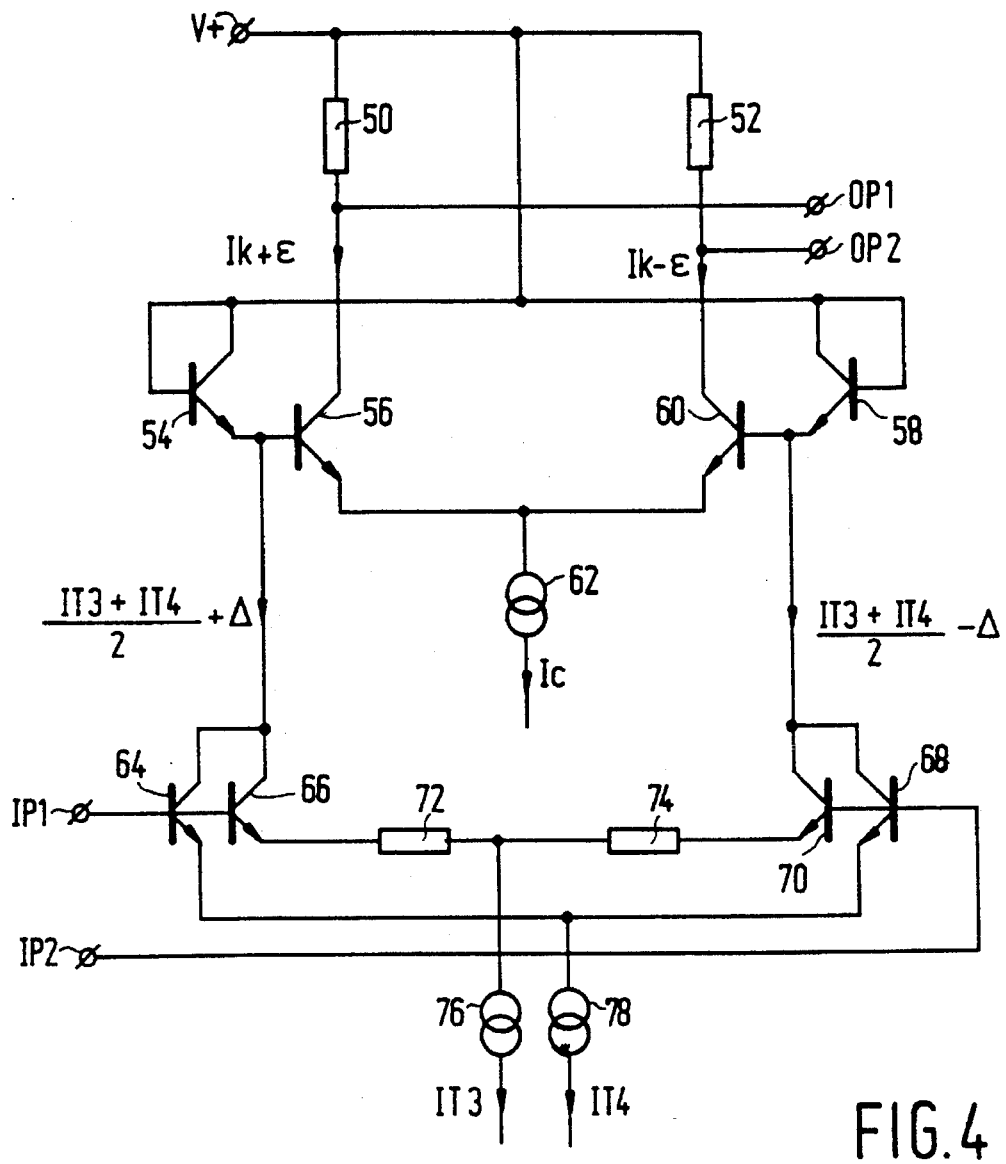
FIG. 4 shows a schematic diagram of an amplifying stage incorporating a translinear variable current amplifier for use as the final stage of a cascaded amplifier in accordance with the invention.

The circuit of such a final stage of the cascaded amplifier is shown as a schematic diagram in FIG. 4.

The positive supply rail V+ is connected to one terminal each of a pair of resistors 50,52 and to the collectors and bases of transistors 54,58. The other terminal of the resistor 50 is connected to the collector of a transistor 56 and to a first output terminal OP1. The other terminal of the resistor 52 is connected to the collector of a transistor 60 and to a second output terminal OP2. The emitter of the transistor 54 is connected to the base of the transistor 56 and to the collectors of transistors 64,66. The emitter of the transistor 58 is connected to the base of the transistor 60 and to the collectors of transistors 68,70. The emitters of the transistors 56,60 are connected together and to a constant current source 62 for providing a current Ic, which is substantially independent of temperature, away from the emitters.

The bases of the transistors 64,66 are connected together and to a first input terminal IP1 and the bases of the transistors 68,70 are connected together and to a second input terminal IP2. The emitters of the transistors 64,68 are connected together and to a temperature dependent current source 78 arranged to provide a PTAT current of IT4 flowing away from the emitters. The emitters of the transistors 66,70 are connected via respective resistors 72,74 to a temperature dependent current source 76 arranged to provide a PTAT current of IT3 flowing away from the emitters. The current sources 76,78 may be realised using the circuit of FIG. 3 together with further transistors having appropriately dimensioned emitters.

The operation of the translinear variable current gain amplifier comprised of transistors 54,56,58,60 is described in "Analysis and synthesis of translinear integrated circuits", University of Pretoria Doctor of Science Thesis, by Seevinck, E at page 217, May 1981. The operation of the translinear amplifier in the circuit shown in FIG. 4 is briefly as follows.

An input voltage is applied between the terminals IP1 and IP2. The summed collector currents of transistors 64,66 are denoted (IT3+IT4)/2+Δ and the summed collector currents of transistors 68,70 are denoted (IT3+IT4)/2−Δ. Δ is the variation in each summed collector current due to the applied input voltage. The currents IT3,IT4 provided by the current sources 76,78 are proportional to absolute temperature. The current variation Δ in the summed collector current of each pair of transistors is caused by the applied stage input voltage and is dependent upon absolute temperature. The collector currents of transistors 56,60 are denoted Ik+ϵ and Ik−ϵ, respectively. The sum of these currents, 2Ik, is provided by current source 62 and is thus substantially constant and substantially equal to Ic. The translinear circuit comprised of matched transistors 54,56,58,60 includes a loop of four base-emitter junctions whose voltages must sum to zero. Consequently, the product of the collector currents in transistors 54 and 56 equals the product of the collector currents in transistors 58 and 60. Thus:

$$((IT3 + IT4)/2 + \Delta)(Ik + \epsilon) = (Ik - \epsilon)((IT3 + IT4)/2 - \Delta)$$

which expands to: $Ik \cdot (IT3 + IT4)/2 + \epsilon \cdot (IT3 + IT4)/2 + \Delta Ik + \Delta \cdot \epsilon = Ik \cdot (IT3 + IT4)/2 - \epsilon \cdot (IT3 + IT4)/2 - \Delta \cdot Ik + \epsilon \cdot \Delta$ which simplifies to: $2\epsilon \cdot (IT3 + IT4)/2 + 2\Delta \cdot Ik = 0$ thus: $\epsilon = \frac{-2\Delta Ik}{IT3 + IT4}$ IT3 and IT4 are governed by the PTAT current sources 76,78 and 2Ik is generated by the constant current source 62 and is thus substantially independent of temperature. Variations in the value of ϵ are therefore inversely proportional to absolute temperature from the equation above. Since the transfer of the combined collector currents of the transistors 64,66 to the collector current of transistor 56 and the transfer of the combined collector currents of the transistors 64,66 to the collector current of transistor 60 are governed by ϵ, the output voltage of the stage is varied in inverse proportion to absolute temperature. The variation in overall output limit voltage from the preceding amplifying stages and which is proportional to absolute temperature is thus substantially corrected by this final stage.

A suitable current source for the device 62 in FIG. 4 which provides a current which is independent of absolute temperature may be provided using a bandgap reference circuit as described in "New developments in IC voltage regulators" by R. J. Widlar and published at pages 2 to 7 of the IEEE Journal of Solid-State Circuits, Volume SC-6, Number 1, January 1971.

FIG. 6 shows three graphs which illustrate the effect of the two-stage temperature compensation technique of the present invention upon a logarithmic cascaded amplifier. In this example the amplifier has a first amplifying stage, as mentioned earlier, without a linear amplifier. Above a certain input voltage, therefore, the output of the cascaded amplifier limits. This can also be considered as adding a further limiting amplifier at the beginning of the cascaded amplifier. The three graphs have horizontal axes representing a positive input voltage Vi on a decibel scale and vertical axes representing the output voltage Vo on a linear scale. The ideal response of a logarithmic amplifier on such axes is a straight diagonal line with positive gradient. A corresponding graph could be drawn for a negative input voltage.

Figure 6A:
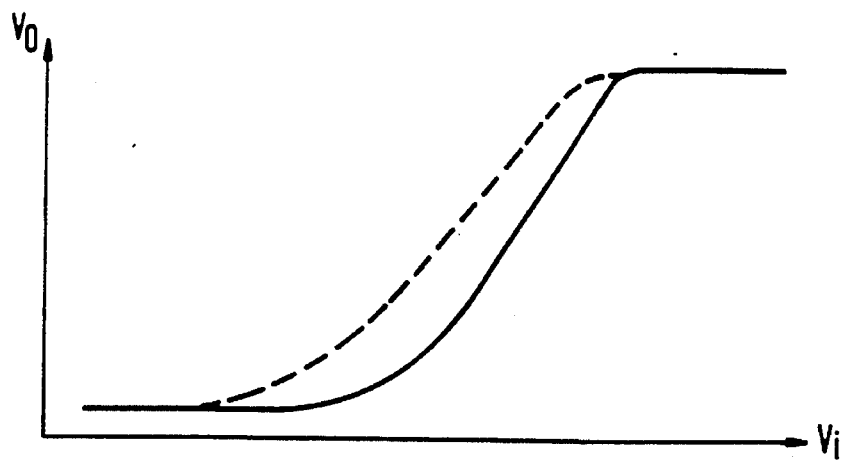
FIGS. 6A, 6B and 6C show three graphs of transfer functions explaining the operation of a cascaded amplifier in accordance with the present invention.
Figure 6B:
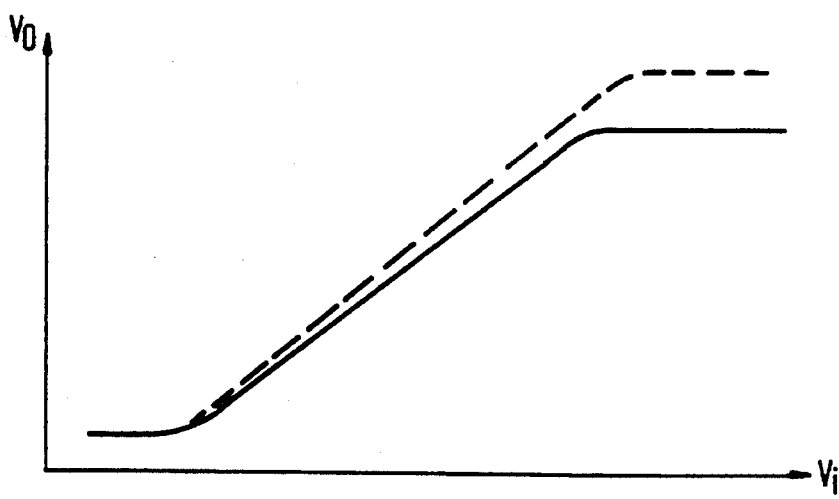

FIG. 6A shows a pair of approximate transfer functions in which the solid line represents the transfer function of an uncompensated cascaded logarithmic amplifier at one temperature and the broken line represents the transfer function of the same amplifier at a lower temperature. The two transfer functions differ over most of their range with the exception of a substantially horizontal section at the right hand side of the graph which results when all of the amplifying stages are limiting. In other words the limiting behaviour of the amplifier is substantially independent of temperature. FIG. 6B shows the transfer function of the cascaded logarithmic amplifier using PTAT current sources in the amplifying stages. The solid line represents the characteristic at one temperature and the broken line represents it at a higher temperature. In this graph the two characteristics are almost identical up to the onset of limiting but that characteristic relating to the higher temperature has a higher temperature dependent limit voltage. This characteristic can prove a significant disadvantage under certain circumstances. For example, in a radio receiver a cascaded logarithmic amplifier might be used to provide dynamic range limiting to a signal before its application to an analogue to digital converter (ADC). If the ADC is provided to handle signals from the amplifier corresponding to its dynamic range output at the lower temperature and the temperature of the amplifier increased, the ADC would limit and distort the signal. Such distortion will usually be unacceptable. Simply including a limiter at the output of the amplifier will also be unsatisfactory as limiters tend to have a gain which varies with temperature.

Figure 6C:
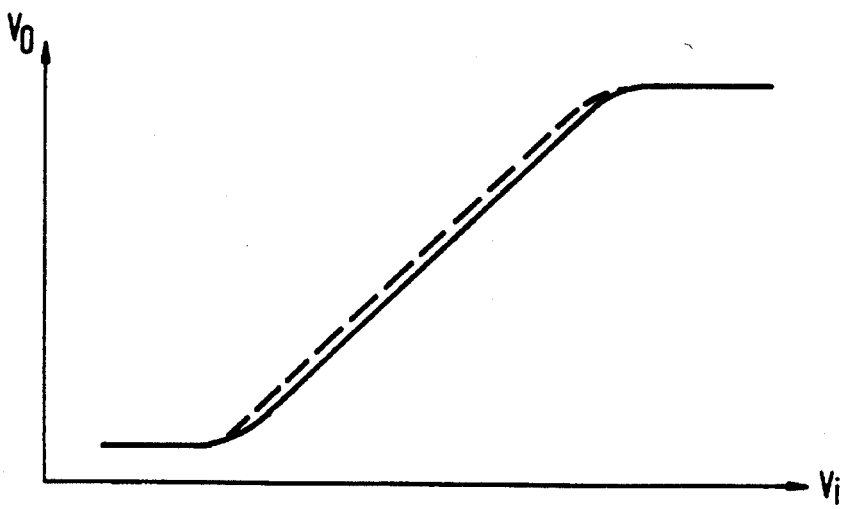

By including an amplifier whose gain is inversely proportional to absolute temperature, such as that shown in FIG. 4 including a translinear circuit, as the final stage of the cascaded amplifier, this temperature dependence can be substantially eliminated. This case is illustrated in FIG. 6C where the solid line which represents the transfer function at a first temperature and the broken line which represents it at a lower temperature are virtually coincident.

Figure 7:
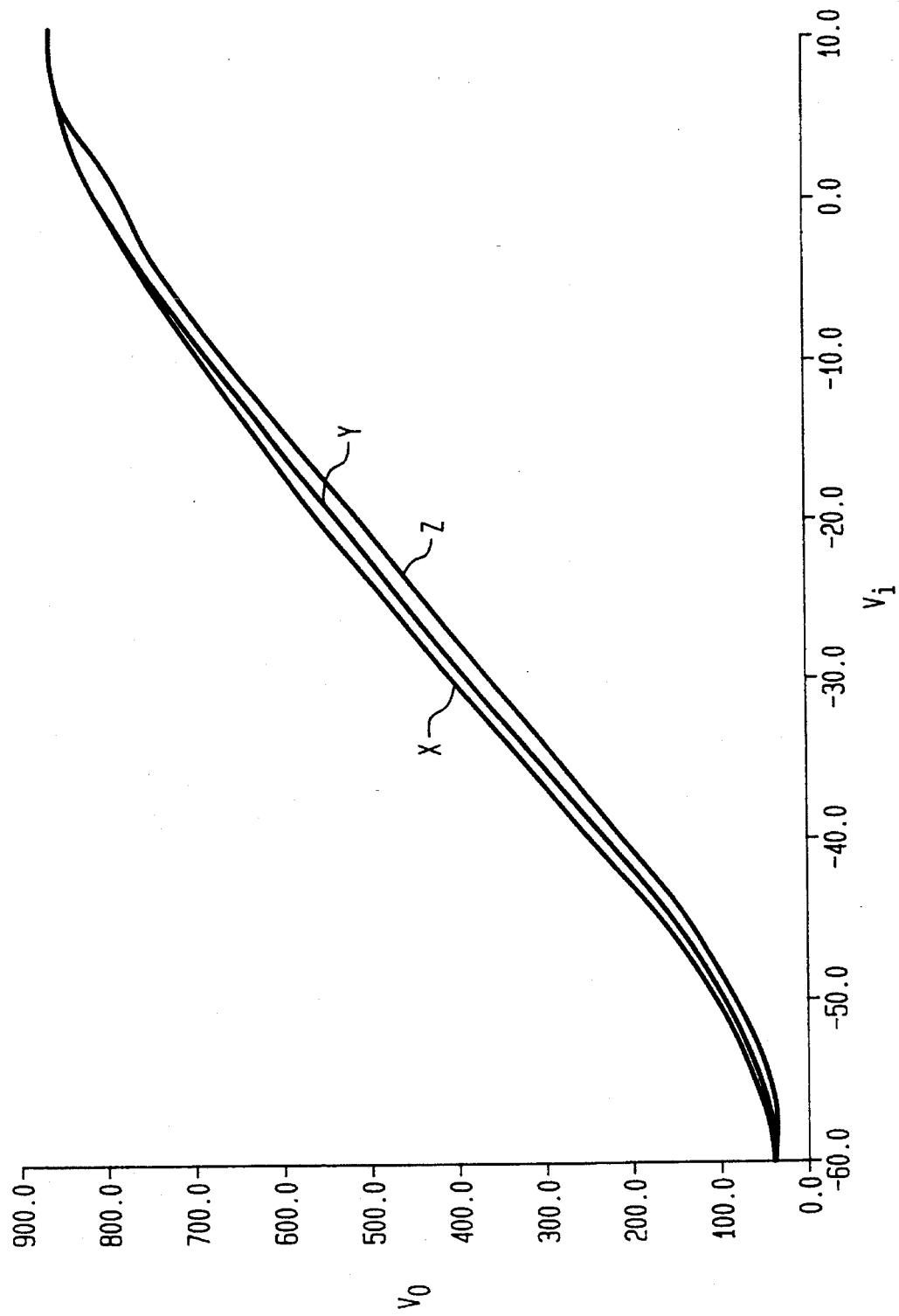
FIG. 7 shows the transfer function of a logarithmic cascaded amplifier in accordance with the invention at three different temperatures.

FIG. 7 shows a graph of the measured performance with temperature of a three stage logarithmic cascaded amplifier in accordance with the invention. The horizontal axis represents the input voltage Vi on a decibel scale and the vertical axis represents the output voltage Vo on a linear scale. The first curve X shows the transfer function of the amplifier at −20° C., the second curve Y shows the transfer function of the amplifier at 25° C. and the third curve Z shows the transfer function of the amplifier at 75° C. As will be seen from the graph, the transfer function of the amplifier varies very little with temperature. What is particularly significant is that in addition to successfully reducing a large variation in output limit voltage, the slight variation in the characteristic is only an input scale variation and not a slope variation. Consequently, accurate measurements of relative amplitude of signals applied to the amplifier are still available regardless of temperature.

To illustrate the design process for determining the component values used in the stages of an amplifier in accordance with the present invention, a three stage amplifier is considered. The three stages are arranged as shown in FIG. 1 and each comprise a linear amplifier having gains of k1,k2 and k3 respectively and a limiting amplifier having gains of A1,A2 and A3 and limiting output voltages of L1,L2 and L3, respectively. The overall input voltage is Vi and the overall output voltage is Vo. The transfer function for the amplifier will have three knee points corresponding to the onset of limiting in the three limiting amplifiers and these points are relatively easy to define. At the onset of limiting in the third and final amplifier stage, the input voltage to that stage will be VI3 given by $$VI3 = \frac{L3}{A3} \qquad (1)$$

The stage output voltage for the third stage is Vo and is comprised of the limiting voltage of the stage limiting amplifier plus the input voltage times the gain of the stage linear amplifier $$Vo = VI3.(A3+k3)$$

The stage input voltage VI2 of the second amplifying stage (which will not be limiting) is given by $$VI2 = \frac{VI3}{A2+k2}$$

so Vo can be derived in terms of VI2, thus:

$$Vo = VI2.(A3+k3).(A2+k2)$$

The first stage input voltage Vi is given by $$Vi = \frac{VI2}{A1+k1}$$

so Vo can be derived in terms of Vi, thus:

$$Vo = Vi.(A3+k3).(A2+k2).(A1+k1) \qquad (2)$$

This equation gives the transfer function of the amplifier at the onset of limiting in the third amplifying stage. As the input voltage Vi increases, the limiting amplifier in the third stage provides no further gain but continues to provide its limited output voltage L3.

At the onset of limiting in the second amplifier stage the input voltage of the second stage will be VI2 given by:

$$VI2 = \frac{L2}{A2} \qquad (3)$$

and the stage output voltage, which is equal to the stage input voltage for the third stage is given by:

$$VI3 = VI2.(A2+k2)$$

The stage input voltage of the first stage, which equals Vi is given by $$Vi = \frac{VI2}{(A1+k1)}$$

so VI3 can be derived in terms of Vi, thus:

$$VI3 = Vi.(A2+k2).(A1+k1)$$

The overall amplifier output voltage Vo at the onset of limiting in the second stage will be given by:

$$Vo = Vi.(A2+k2).(A1+k1) \quad (4)$$

(since the third stage will be limiting).

At the onset of limiting in the first amplifier stage the input voltage Vi of the first stage will be given by:

$$Vi = \frac{L1}{A1} \quad (5)$$

and the stage output voltage, which is equal to the second stage input voltage, will be given by:

$$VI2 = Vi.(A1+k1)$$

The stage output for the second stage will be given by:

$$VI3 = Vi.(A1+k1).k2 + L2$$

(since the second stage will be limiting).

The overall amplifier output Vo will be given by:

$$Vo = [Vi.(A1+k1).k2 + L2].k3 + L3 \quad (6)$$

(since the third stage will be limiting).

The equations (1),(3),(5) give the stage input voltages for the onset of limiting in the three stages. The equations (2),(4),(6) give the transfer functions of the cascaded amplifier at these three onsets of limiting. By using these equations, the stage amplifier parameters for a very large variety of transfer functions can be derived.

To design a cascaded amplifier having a first stage which comprises only a limiting amplifier the above procedure needs only slight modification. The term k1 is simply omitted from all of the equations and the design procedure carried out as described.

The procedure above can be repeated as necessary to derive transfer functions for cascaded amplifiers having more than three stages. However, the number of variables involved in the closed form determination of the amplifier parameters is prohibitive. To simplify the design process, the values of the variables can be constrained in a number of ways. Conveniently the limiting voltages of all of the limiting amplifiers may be constrained to be equal. Alternatively the sum (A+k) for each stage can be constrained to be equal while the individual values of An and kn are varied for each stage in accordance with the equations above and the desired transfer function. Other means for reducing the number of variables are available.

Besides a logarithmic transfer function and other sub-linear transfer functions, an amplifier in accordance with the present invention may be arranged to provide a super-linear transfer function, that is a transfer function having a gain which increases with the magnitude of the input to the amplifier, as well as other generally non-linear transfer functions. To obtain such transfer functions, the limiting amplifier in one or more stages is arranged to have a negative value of gain whose absolute value is less than the absolute value of the gain of the linear amplifier. The output of the limiting amplifier thus provides an effect which counters the output of the linear amplifier until the onset of limiting is reached. The gain of such an amplifier stage thus increases at input levels above the onset of limiting since the limiting amplifier is not then providing any negative slope gain. A cascaded amplifier composed solely of such stages will provide a super-linear transfer function. A cascaded amplifier comprised of a mixture of sub-linear and super-linear stages can be arranged to provide an overall amplifier transfer function having a particular non-linear transfer function.

Figure 5:
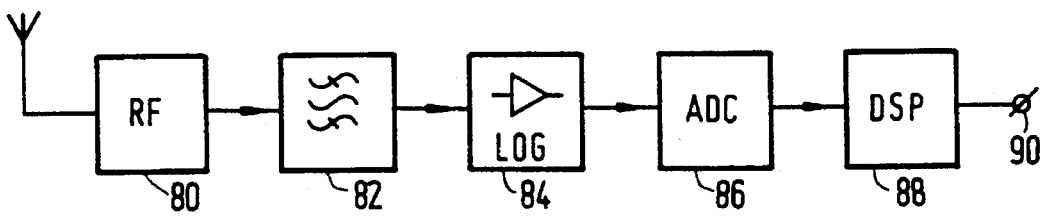
FIG. 5 shows a block schematic diagram of a radio receiver incorporating a logarithmic cascaded amplifier in accordance with the present invention.

FIG. 5 shows a block schematic diagram of a radio receiver in accordance with the present invention. Radio signals having a large dynamic range are received by an antenna connected to a R.F. stage 80 which down converts the signals to an intermediate frequency and supplies them to a band-pass filter 82. The output of the filter 82 is fed to a cascaded logarithmic amplifier 84 as described above to reduce the dynamic range of the filtered signal and provide a compressed signal to an analogue to digital converter (ADC) 86. The digitised output of the ADC is fed to a digital signal processor (DSP) 88 which provides demodulation for the digitised signal to provide an output signal at a terminal 90. A zero IF architecture may be used which comprises in-phase and quadrature channels substantially at baseband.

From reading the present disclosure, other modifications will be apparent to persons skilled in the art. Such modifications may involve other features which are already known in the field of cascaded amplifiers and components parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A cascaded amplifier comprising a plurality of amplifying stages coupled in cascade, each amplifying stage comprising a linear amplifier and a limiting amplifier, the linear amplifier and the limiting amplifier being provided with a stage input signal and providing respective output signals which are combined to provide a stage output signal, wherein each amplifying stage in the cascade further comprises a temperature dependent device for controlling the small signal gain of that amplifying stage to be substantially independent of temperature and a final stage of the amplifier comprises an overall temperature dependent device for controlling the overall output limit voltage of the cascaded amplifier to be substantially independent of temperature.

2. An amplifier as claimed in claim 1, wherein overall temperature dependent device of the final amplifying stage comprises a controlling device for controlling the gain of that stage to be substantially inversely proportional to absolute temperature.

3. An amplifier as claimed in claim 2, wherein the final amplifying stage includes a translinear circuit.

4. An amplifier as claimed in claim 3, further comprising a constant current source coupled to the translinear circuit.

5. An amplifier as claimed in claim 1 further comprising a limiting amplifier having an output coupled to a first cascaded amplifying stage.

6. An amplifier as claimed in claim 1, wherein the linear amplifier of each amplifying stage is arranged to have a gain of unity and the amplifier provides a substantially logarithmic transfer function.

7. A radio receiver comprising a radio frequency state including frequency down-conversion means for providing a down converted signal to a logarithmic amplifier including a plurality of amplifying stages coupled in cascade, each amplifying stage comprising a linear amplifier and a limiting amplifier, wherein the linear amplifier of each amplifying stage is arranged to have a gain of unity and the logarithmic amplifier provides a substantially logarithmic transfer function, the linear amplifier and the limiting amplifier being provided with a stage input signal and providing respective output signals which are combined to provide a stage output signal, wherein each amplifying stage in the cascade further comprises a temperature dependent device for controlling the small signal gain of that amplifying stage to be substantially independent of temperature and a final stage of the logarithmic amplifier comprises an overall temperature dependent device for controlling the overall output limit voltage of the cascaded amplifier to be substantially independent of temperature and wherein an output of the logarithmic amplifier is substantially logarithmically related to the down-converted signal being provided to a digitizing device to provide a digital signal to a digital signal processor.

8. An amplifier as claimed in claim 4, further comprising a limiting amplifier having an output coupled to a first cascaded amplifying stage.

9. An amplifier as claimed in claim 5, wherein the linear amplifier of each amplifying stage is arranged to have a gain of unity and the amplifier provides a substantially logarithmic transfer function.

10. An amplifier as claimed in claim 8, wherein the linear amplifier of each amplifying stage is arranged to have a gain of unity and the amplifier provides a substantially logarithmic transfer function.

11. An amplifier as claimed in claim 1, wherein at least one amplifying stage of said plurality does not include a linear amplifier.

12. As amplifier as claimed in claim 1, wherein a limiting amplifier of an amplifying stage is arranged to have a negative value of gain and the gain has an absolute value less than the absolute value of the gain of a linear amplifier within the amplifying stage.

13. A logarithmic amplifier having an input and an output which provides an output signal which retains information about the sign of an input signal, comprising:

a plurality of amplifying stages coupled in cascade, each amplifying stage in the cascade further comprising a temperature dependent device for controlling the small signal gain of that amplifying stage to be substantially independent of temperature; and a final stage of the amplifier including an overall temperature dependent device for controlling the overall output limit voltage of the logarithmic amplifier to be substantially independent of temperature.

* * * * *